(12) United States Patent
Tseng et al.

(10) Patent No.: US 8,832,526 B2
(45) Date of Patent: Sep. 9, 2014

(54) DATA READING METHOD, MEMORY CONTROLLER, AND MEMORY STORAGE DEVICE

(75) Inventors: Chien-Fu Tseng, Yunlin County (TW); Kuo-Hsin Lai, Hsinchu County (TW)

(73) Assignee: Phison Electronics Corp., Miaoli (TW)

( * ) Notice: Subject to any disclaimer, the term of this patent is extended or adjusted under 35 U.S.C. 154(b) by 395 days.

(21) Appl. No.: 13/190,487

(22) Filed: Jul. 26, 2011

(65) Prior Publication Data

US 2012/0311402 A1    Dec. 6, 2012

(30) Foreign Application Priority Data

Jun. 2, 2011  (TW) .............................. 100119408 A

(51) Int. Cl.
| | | |
|---|---|---|
| G11C 29/00 | (2006.01) | |
| G06F 11/10 | (2006.01) | |
| H03M 13/00 | (2006.01) | |
| G11C 29/50 | (2006.01) | |
| G11C 29/02 | (2006.01) | |
| G11C 29/04 | (2006.01) | |
| H03M 13/15 | (2006.01) | |
| H03M 13/29 | (2006.01) | |

(52) U.S. Cl.
CPC .... *G06F 11/1048* (2013.01); *G11C 2029/0409* (2013.01); *H03M 13/612* (2013.01); *G11C 2029/0411* (2013.01); *H03M 13/152* (2013.01); *G11C 29/50004* (2013.01); *H03M 13/2906* (2013.01); *G11C 2029/0401* (2013.01); *G11C 29/028* (2013.01)
USPC ....................................... 714/763

(58) Field of Classification Search
CPC . G06F 11/1072; G06F 11/1048; G11C 29/42; G11C 29/5004; G11C 11/5642; G11C 11/5628
USPC ................ 714/701, 721, 774, 780, 763–764, 714/769–770, 773
See application file for complete search history.

(56) References Cited

U.S. PATENT DOCUMENTS

| | | | | |
|---|---|---|---|---|
| 7,958,301 | B2 * | 6/2011 | Sutardja ........................ | 711/103 |
| 7,966,546 | B2 * | 6/2011 | Mokhlesi et al. ............. | 714/773 |
| 8,156,403 | B2 * | 4/2012 | Shalvi et al. .................. | 714/764 |

FOREIGN PATENT DOCUMENTS

| | | |
|---|---|---|
| TW | 99111612 | 4/2010 |
| TW | 99131626 | 9/2010 |

* cited by examiner

*Primary Examiner* — Shelly A Chase
(74) *Attorney, Agent, or Firm* — Jianq Chyun IP Office

(57) ABSTRACT

A data reading method adapted to a rewritable non-volatility memory module having physical blocks is provided, wherein each physical block has a plurality of physical pages. In the data reading method, each physical page is partitioned into bit data areas, where at least one of the bit data areas has a data length different from that of the other bit data areas. Data is written into the bit data areas. Data in each bit data area is corresponding to an ECC frame. The data is read from the bit data areas. Because the at least one of bit data areas has a relatively short data length, the error correction capability is improved and the data can be correctly read. An error bit information is obtained according to the read data. A log likelihood ratio (LLR) lookup table or a threshold voltage is adjusted according to the error bit information.

21 Claims, 10 Drawing Sheets

|  |  |  |  | A storage error occurs in the LSB | A storage error occurs in the CSB | A storage error occurs in the MSB |
|---|---|---|---|---|---|---|
| FIRST STORAGE STATE | 0 | 0 | 0 | * | 010 → 000 | 001 → 000 |
|  | 0 | 0 | 1 | 101 → 001 | * | 000 → 001 |
|  | 0 | 1 | 0 | * | 000 → 010 | 011 → 010 |
|  | 0 | 1 | 1 | * | * | 010 → 011 |
|  | 1 | 0 | 0 | * | 110 → 100 | 101 → 100 |
|  | 1 | 0 | 1 | 001 → 101 | * | 100 → 101 |
|  | 1 | 1 | 0 | * | 100 → 110 | 111 → 110 |
|  | 1 | 1 | 1 | * | * | 110 → 111 |

US 8,832,526 B2

DATA READING METHOD, MEMORY CONTROLLER, AND MEMORY STORAGE DEVICE

CROSS-REFERENCE TO RELATED APPLICATION

This application claims the priority benefit of Taiwan application serial no. 100119408, filed on Jun. 2, 2011. The entirety of the above-mentioned patent application is hereby incorporated by reference herein and made a part of this specification.

BACKGROUND OF THE INVENTION

1. Field of the Invention

The invention generally relates to a memory system, and more particularly, to a data reading method with optimal error bit correction capability, and a memory controller and a memory storage device using the same.

2. Description of Related Art

Existing flash memories can be categorized into NOR flash memories and NAND flash memories. NAND flash memory has two different storage modes: a multi-level cell (MLC) storage mode and a single-level cell (SLC) storage mode. In the SLC storage mode, one data bit is stored in each memory cell. While in the MLC storage mode, two or more data bits are stored in each memory cell.

Generally speaking, while writing data into or reading data from a specific memory cell in a memory cell array connected by bit lines and word lines, memory cells other than the specific memory cell are disturbed, and accordingly the threshold voltage for writing data into these memory cells are changed. In addition, wear caused by long-term idle, electric leakage, or repeated erasing or programming operations may also change the threshold voltage for writing data into a memory cell. Thus, errors may occur when a written data is read.

On the other hand, a memory storage device needs to adopt an error correcting technique (for example, the low density parity check code (LDPC code) technique) with optimal error correction capability to perform an error checking and correcting (ECC) procedure on data. The memory storage device obtains a log likelihood ratio (LLR) corresponding to soft information according to a lookup table stored in the memory storage device and then performs an error correcting operation by using a LDPC code. However, the error characteristics of a rewritable non-volatile memory in the memory storage device change with the increase of erase-program times. Accordingly, in order to obtain the optimal LLR, the error characteristics of the rewritable non-volatile memory have to be constantly determined. As a result, the load of the system will be drastically increased.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY OF THE INVENTION

Accordingly, the invention is directed to a data reading method with optimal error bit correction capability, in which a log likelihood ratio (LLR) lookup table or a threshold voltage of memory cells can be selectively adjusted according to an error bit information.

The invention is directed to a memory controller with optimal error bit correction capability, in which an LLR lookup table or a threshold voltage of memory cells can be selectively adjusted according to an error bit information.

The invention is directed to a memory storage device with optimal error bit correction capability, in which an LLR lookup table or a threshold voltage of memory cells can be selectively adjusted according to an error bit information.

The invention provides a data reading method adapted to a rewritable non-volatility memory module. The rewritable non-volatility memory module has a plurality of physical blocks, and each of the physical blocks has a plurality of physical pages. The data reading method includes following steps. Each of the physical pages is partitioned into a plurality of bit data areas. In each of the physical pages, at least one of the bit data areas has a data length different from the data length of the other bit data areas. Data is written into the bit data areas, where each of the bit data areas is corresponding to an error checking and correcting (ECC) frame, and among the ECC frames, the ECC frame corresponding to the at least one bit data area has a relatively short data length. The data is read from the bit data areas. A data processing procedure is executed according to the read data to obtain an error bit information. An LLR lookup table or at least one threshold voltage of memory cells is adjusted according to the error bit information.

The invention provides a memory controller including a host system interface, a memory interface, a memory management circuit, and an LLR estimation circuit. The host system interface is coupled to a host system. The memory interface is coupled to a rewritable non-volatility memory module. The rewritable non-volatility memory module has a plurality of physical blocks, and each of the physical blocks has a plurality of physical pages. The memory management circuit is coupled to the host system interface and the memory interface. The memory management circuit partitions each of the physical pages into a plurality of bit data areas, writes data into the bit data areas, reads the data from the bit data areas, executes a data processing procedure according to the read data to obtain an error bit information, and adjusts at least one threshold voltage of memory cells according to the error bit information. The LLR estimation circuit is coupled to the memory management circuit. The LLR estimation circuit adjusts an LLR lookup table according to the error bit information. In each of the physical pages, at least one of the bit data areas has a data length different from the data length of the other bit data areas. Data in each of the bit data areas is corresponding to an ECC frame, and among the ECC frames, the ECC frame corresponding to the at least one bit data area has a relatively short data length.

The invention provides a memory storage device including a connector, a rewritable non-volatility memory module, and a memory controller. The connector is coupled to a host system. The rewritable non-volatility memory module has a plurality of physical blocks, and each of the physical blocks has a plurality of physical pages. The memory controller is coupled to the rewritable non-volatility memory module and the connector. The memory controller partitions each of the physical pages into a plurality of bit data areas, writes data into the bit data areas, reads the data from the bit data areas, executes a data processing procedure according to the read data to obtain an error bit information, and adjusts an LLR lookup table or at least one threshold voltage of memory cells according to the error bit information. In each of the physical pages, at least one of the bit data areas has a data length different from the data length of the other bit data areas. Data in each of the bit data areas is corresponding to an ECC frame, and among the ECC frames, the ECC frame corresponding to the at least one bit data area has a relatively short data length.

These and other exemplary embodiments, features, aspects, and advantages of the invention will be described and become more apparent from the detailed description of exemplary embodiments when read in conjunction with accompanying drawings.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
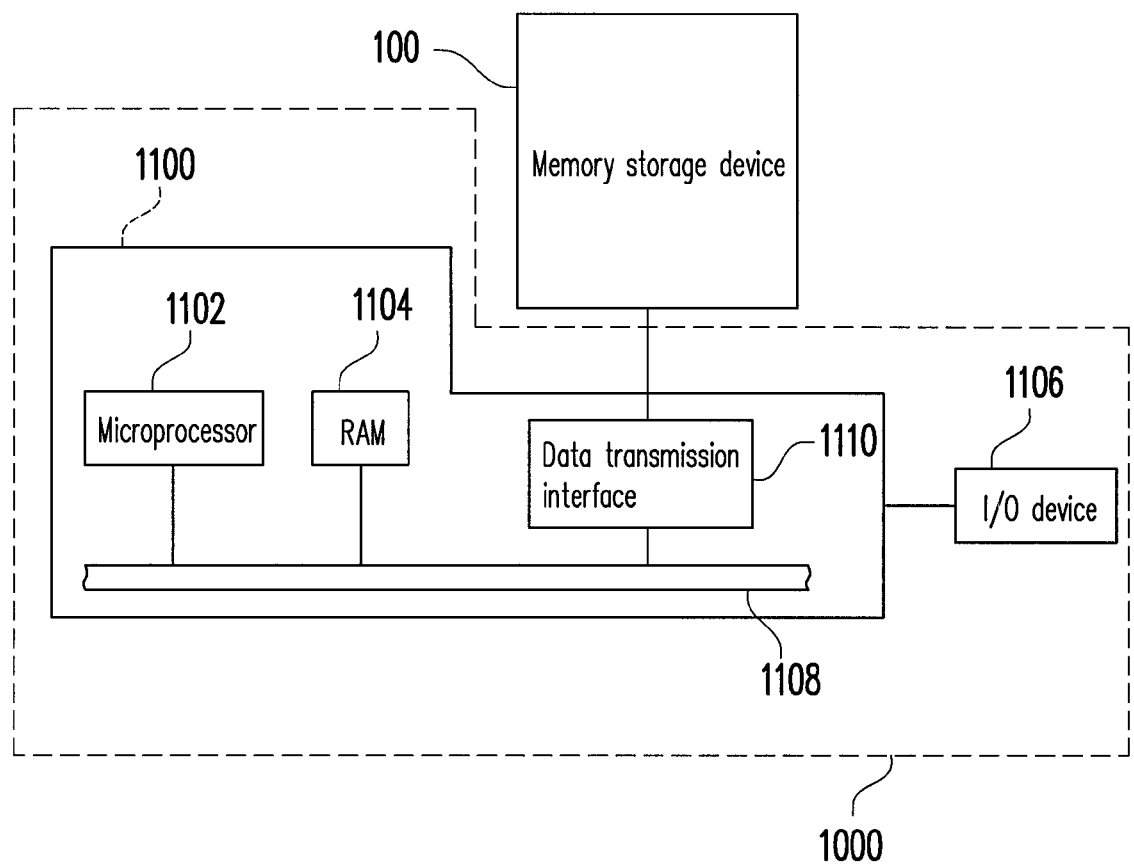
FIG. 1A illustrates a host system using a rewritable non-volatile memory storage device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

According to the invention, in each physical page, at least one bit data area has a data length different from that of the other bit data areas. The error checking and correcting (ECC) frame corresponding to the bit data area having the relatively short data length offers an optimal error bit correction capability. Thus, when a memory storage device executes an ECC procedure on a read data, the data can be effectively corrected. In addition, the memory storage device selectively adjusts a log likelihood ratio (LLR) lookup table or a threshold voltage of memory cells according to an error bit information. Below, the invention will be described in detail with reference to several exemplary embodiments and accompanying drawings.

FIG. 1A illustrates a host system using a rewritable non-volatile memory storage device according to an exemplary embodiment of the invention.

Figure 1B:
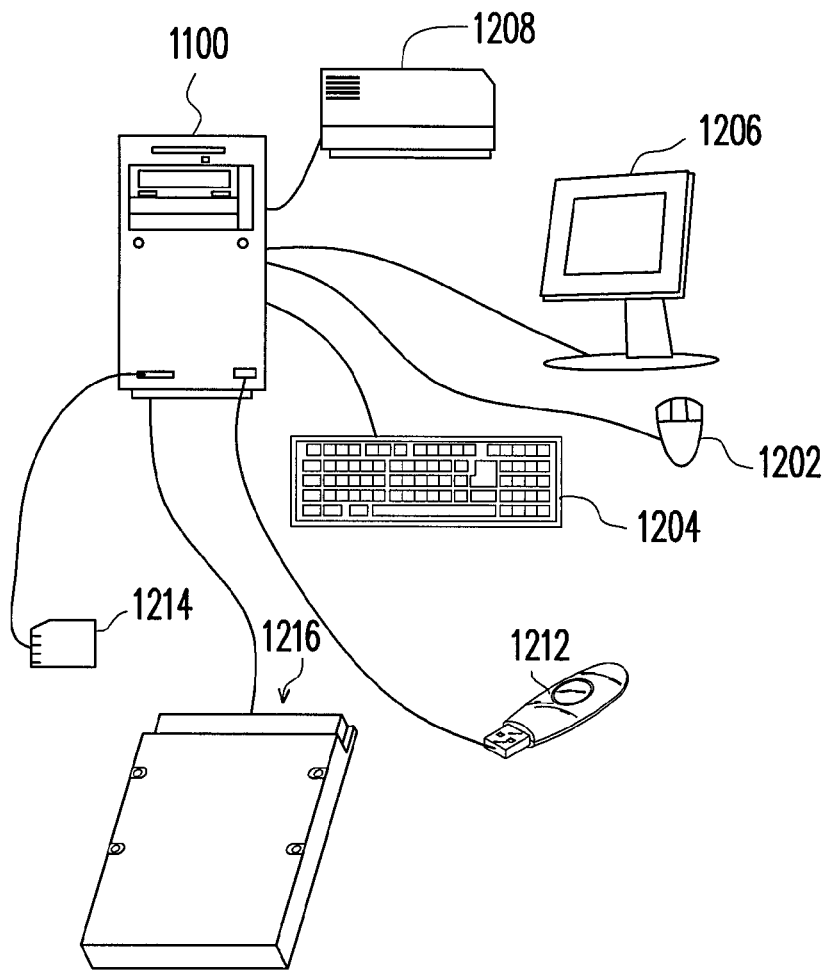
FIG. 1B is a diagram of a computer, an input/output device, and a memory storage device according to an exemplary embodiment of the invention.

Referring to FIG. 1A, the host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208, as shown in FIG. 1B. However, the I/O device 1106 is not limited to the devices illustrated in FIG. 1B and may further include other devices.

In the present exemplary embodiment, the rewritable non-volatile memory storage device 100 is coupled to other components of the host system 1000 through the data transmission interface 1110. Data can be written into or read from the rewritable non-volatile memory storage device 100 through the operations of the microprocessor 1102, the RAM 1104, and the I/O device 1106. The rewritable non-volatile memory storage device 100 may be the flash drive 1212, the memory card 1214, or the solid state drive (SSD) 1216 illustrated in FIG. 1B.

Figure 1C:
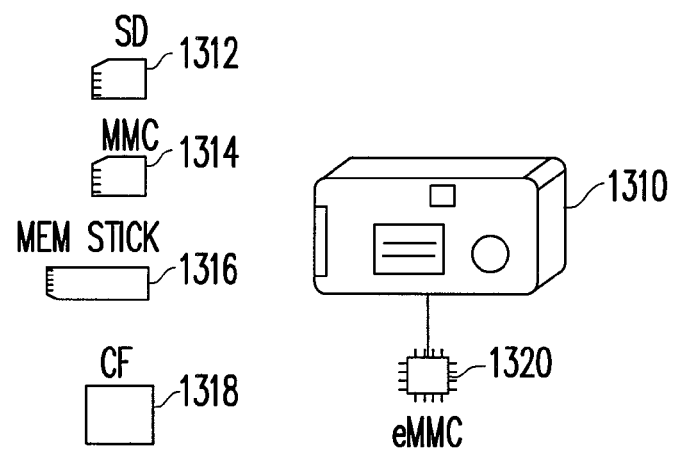
FIG. 1C is a diagram of a host system and a memory storage device according to another exemplary embodiment of the invention.

Generally, the host system 1000 may be substantially any system that can store data. Even though the host system 1000 is described as a computer system in the present exemplary embodiment, in another exemplary embodiment of the invention, the host system 1000 may also be a digital camera, a video camera, a communication device, an audio player, or a video player. For example, if the host system is a digital camera (video camera) 1310, the rewritable non-volatile memory storage device is then a secure digital (SD) card 1312, a multi media card (MMC) card 1314, a memory stick (MS) 1316, a compact flash (CF) card 1318, or an embedded storage device 1320 (as shown in FIG. 1C) used by the digital camera (video camera) 1310. The embedded storage device 1320 includes an embedded MMC (eMMC). It should be mentioned that the eMMC is directly coupled to the motherboard of the host system.

Figure 2:
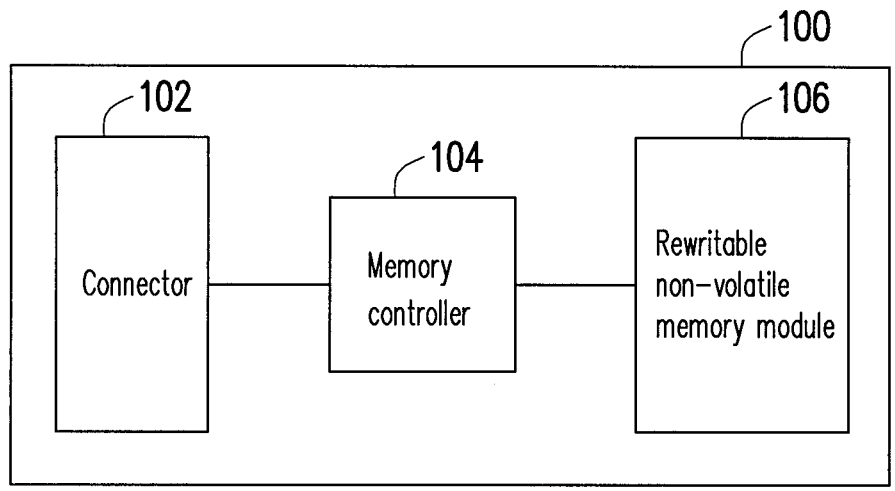
FIG. 2 is a schematic block diagram of the memory storage device in FIG. 1A.

FIG. 2 is a schematic block diagram of the memory storage device in FIG. 1A.

Referring to FIG. 2, the memory storage device 100 includes a connector 102, a memory controller 104, and a rewritable non-volatility memory module 106.

In the present exemplary embodiment, the connector 102 is compatible to the serial advanced technology attachment (SATA) standard. However, the invention is not limited thereto, and the connector 102 may also be compatible to the Institute of Electrical and Electronic Engineers (IEEE) 1394 standard, the parallel advanced technology attachment (PATA) standard, the peripheral component interconnect (PCI) express standard, the universal serial bus (USB) standard, the SD interface standard, the MS interface standard, the MMC interface standard, the CF interface standard, the integrated device electronics (IDE) standard or any other suitable standard.

The memory controller 104 executes a plurality of logic gates or control instructions implemented in a hardware form or a firmware form and performs various data operations on the rewritable non-volatile memory module 106 according to commands issued by the host system 1000.

The rewritable non-volatile memory module 106 is coupled to the memory controller 104 and configured to store data written by the host system 1000. In the present exemplary embodiment, the rewritable non-volatile memory module 106 is a multi level cell (MLC) NAND flash memory module. However, the invention is not limited thereto, and the rewritable non-volatility memory module 106 may also be a single level cell (SLC) NAND flash memory module, any other rewritable non-volatility memory module, or any other memory module having the same characteristics.

Figure 3:
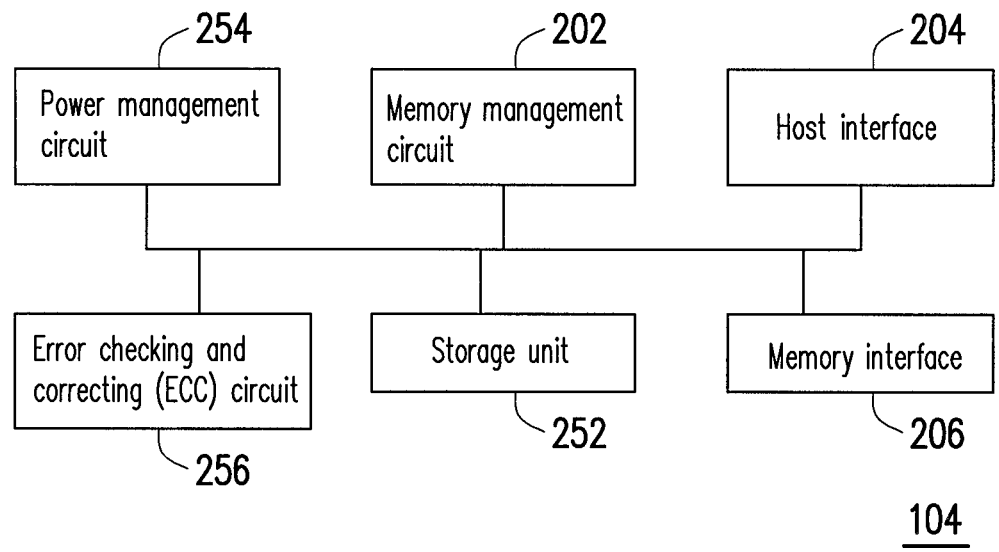
FIG. 3 is a schematic block diagram of a memory controller according to an exemplary embodiment of the invention.

FIG. 3 is a schematic block diagram of a memory controller according to an exemplary embodiment of the invention.

Referring to FIG. 3, the memory controller 104 includes a memory management circuit 202, a host interface 204, and a memory interface 206.

The memory management circuit 202 controls the overall operation of the memory controller 104. To be specific, the memory management circuit 202 has a plurality of control instructions, and when the memory storage device 100 is in operation, the control instructions are executed to perform various data operations.

In the present exemplary embodiment, the control instructions of the memory management circuit 202 are implemented in a firmware form. For example, the memory management circuit 202 has a microprocessor unit (not shown) and a read-only memory (ROM, not shown), and these control instructions are burnt into the ROM. When the memory storage device 100 is in operation, the control instructions are executed by the microprocessor unit to perform various data operations.

In another exemplary embodiment of the invention, the control instructions of the memory management circuit 202 may also be stored in a specific area of the rewritable non-volatile memory module 106 (for example, a system area exclusively used for storing system data in a memory module) as program codes. In addition, the memory management circuit 202 has a microprocessor unit (not shown), a ROM (not shown), and a RAM (not shown). Particularly, the ROM has a driver code, and when the memory controller 104 is enabled, the microprocessor unit first executes the driver code to load the control instructions from the rewritable non-volatile memory module 106 into the RAM of the memory management circuit 202. After that, the microprocessor unit runs these control instructions to perform various data operations. Additionally, in yet another exemplary embodiment of the invention, the control instructions of the memory management circuit 202 may also be implemented in a hardware form.

The host interface 204 is coupled to the memory management circuit 202 and configured to receive and identify commands and data sent by the host system 1000. Namely, commands and data sent by the host system 1000 are transmitted to the memory management circuit 202 via the host interface 204. In the present exemplary embodiment, the host interface 204 is compatible to the SATA standard. However, the invention is not limited thereto, and the host interface 204 may also be compatible to the PATA standard, the IEEE 1394 standard, the PCI express standard, the USB standard, the SD standard, the MS standard, the MMC standard, the CF standard, the IDE standard, or any other suitable data transmission standard.

The memory interface 206 is coupled to the memory management circuit 202 and configured to access the rewritable non-volatile memory module 106. Namely, data to be written into the rewritable non-volatile memory module 106 is converted by the memory interface 206 into a format acceptable to the rewritable non-volatile memory module 106.

In an exemplary embodiment of the invention, the memory controller 104 further includes a storage unit 252. The storage unit 252 is coupled to the memory management circuit 202 and configured to temporarily store data and commands from the host system 1000, or data from the rewritable non-volatility memory module 106.

In an exemplary embodiment of the invention, the memory controller 104 further includes a power management circuit 254. The power management circuit 254 is coupled to the memory management circuit 202 and configured to control the power supply of the memory storage device 100.

In an exemplary embodiment of the invention, the memory controller 104 further includes an ECC circuit 256. The ECC circuit 256 is coupled to the memory management circuit 202 and configured to execute an ECC procedure to ensure data accuracy. To be specific, when the memory management circuit 202 receives a write command from the host system 1000, the ECC circuit 256 generates a corresponding ECC code for the data corresponding to the write command, and the memory management circuit 202 writes the data corresponding to the write command and the corresponding ECC code into the rewritable non-volatility memory module 106. Thereafter, when the memory management circuit 202 reads the data from the rewritable non-volatility memory module 106, it also reads the ECC code corresponding to the data, and the ECC circuit 256 executes the ECC procedure on the data according to the ECC code.

It should be noted that in an exemplary embodiment of the invention, in each physical page of the rewritable non-volatility memory module, at least one bit data area has a data length different from the data length of the other bit data areas. The ECC frame corresponding to the bit data area having the relatively short data length offers an optimal error bit correction capability. Thus, when the ECC circuit 256 executes the ECC procedure on a read data, the data can be effectively checked and corrected and obtain error bit information. Accordingly, the memory management circuit 202 can selectively adjust the LLR lookup table or the threshold voltage of the memory cells according to obtained error bit information.

Taking an 8 KB physical page as an example, if the memory management circuit 202 evenly partitions the physical page into 8 bit data areas, each of the bit data areas can store 1 KB data. However, in this case, even if an ECC frame is adopted with a 42-bit Bose, Ray-Chaudhuri, Hocquenghem (BCH) code, the correction capability of the ECC frame cannot reach a decoder output of $10^{-14}$ bit error rate (BER).

Figure 4:
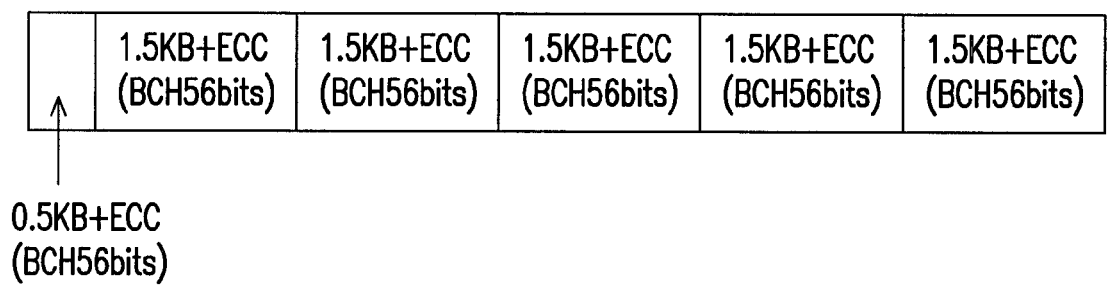
FIG. 4 is a structural diagram of bit data areas in a physical page of a rewritable non-volatility memory module according to an exemplary embodiment of the invention.

FIG. 4 is a structural diagram of bit data areas in a physical page of a rewritable non-volatility memory module according to an exemplary embodiment of the invention.

Referring to FIG. 4, in the present exemplary embodiment, when the memory management circuit 202 partitions each physical page, the memory management circuit 202 partitions the physical page into bit data areas having different data lengths. In particular, a bit data area having a relatively short data length is configured at the starting position of each physical page, wherein the ECC frame corresponding to the bit data area having the relatively short data length offers an optimal error bit correction capability.

For example, in the present exemplary embodiment, the memory management circuit 202 partitions each physical page into 6 bit data areas, where the bit data area at the starting position has a data length of 0.5 KB, while each of the other bit data areas has a data length of 1.5 KB. Herein each bit data area is corresponding to an ECC frame with a 56-bit BCH code. Thus, the ECC frame with the 56-bit BCH code corresponding to the 0.5 KB bit data area offers an optimal error bit correction capability. The ECC frame corresponding to the bit data area having the relatively short data length is referred to as a leading ECC frame.

As to the bit data area having the relatively short data length, the leading ECC frame with the 56-bit BCH code offers a decoder output of $10^{-14}$ BER. When the ECC circuit 256 performs the ECC procedure on the data read from the bit data area having the relatively short data length, the data can be effectively checked and corrected. Thus, the ECC circuit 256 can provide an appropriate error bit information, and accordingly the memory management circuit 202 can selectively adjust the LLR lookup table or the threshold voltage of the memory cells according to the error bit information.

It should be noted that even though in the present exemplary embodiment, the bit data area having the relatively short data length is configured at the starting position of each physical page, the invention is not limited thereto. In other exemplary embodiments, the bit data area having the relatively short data length may also be configured between any two 1.5 KB bit data areas. In addition, the number and lengths of the bit data areas in each physical page are not limited in the invention.

After the memory management circuit 202 obtains an appropriate error bit information, it selectively adjusts the LLR lookup table or the threshold voltage of the memory cells. Below, how the LLR lookup table and the threshold voltage of the memory cells are adjusted will be explained with reference to different exemplary embodiments and accompanying drawings.

Figure 5:
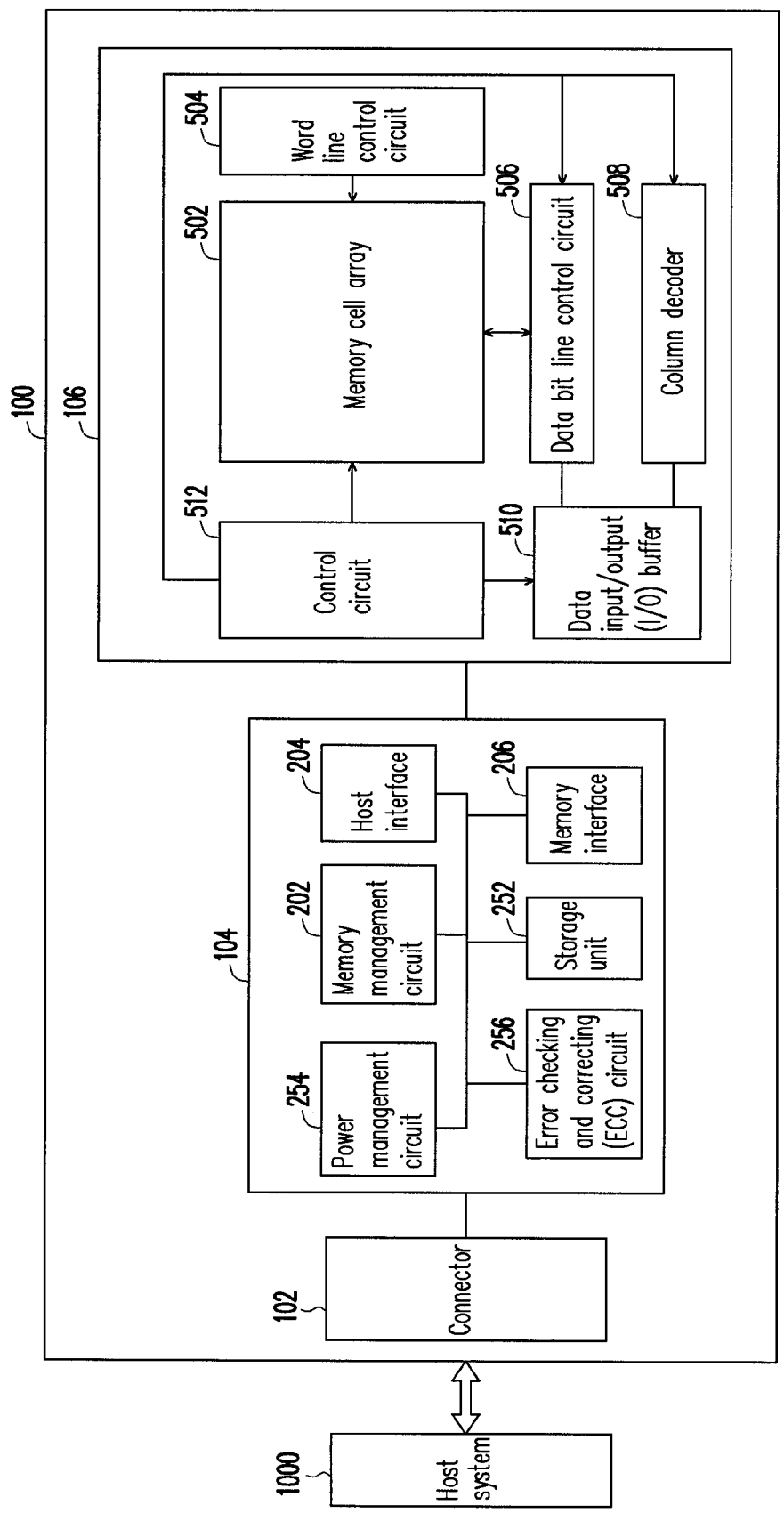
FIG. 5 is a schematic block diagram of a memory storage device according to an exemplary embodiment of the invention.

FIG. 5 is a schematic block diagram of a memory storage device according to an exemplary embodiment of the invention.

Referring to FIG. 3 and FIG. 5, the memory storage device 100 is used with the host system 1000 so that the host system 1000 can write data into or read data from the memory storage device 100.

The memory controller 104 includes the memory management circuit 202, the host interface 204, the memory interface 206, the storage unit 252, the power management circuit 254, and the ECC circuit 256. The structure and function of the memory controller 104 have been described above therefore will not be described herein.

The rewritable non-volatility memory module 106 is configured to store data written by the host system 1000. In the present exemplary embodiment, the rewritable non-volatility memory module 106 is a MLC flash memory module, and which includes a memory cell array 502, a word line control circuit 504, a bit line control circuit 506, a column decoder 508, a data input/output (I/O) buffer 510, and a control circuit 512.

The memory cell array 502 includes a plurality of memory cells (not shown) for storing data, a plurality of bit lines (not shown) for connecting these memory cells, a plurality of word lines, and a plurality of common source lines (not shown). The memory cells are disposed at where the bit lines intersect the word lines as an array. When a write command or a read command is received from the memory controller 104, the control circuit 512 controls the word line control circuit 504, the bit line control circuit 506, the column decoder 508, and the data I/O buffer 510 to write data into the memory cell array 502 or read data from the memory cell array 502. Herein the word line control circuit 504 controls a word line voltage supplied to the word lines, the bit line control circuit 506 controls the bit lines, the column decoder 508 selects the corresponding bit line according to a decoder row address in the received command, and the data I/O buffer 510 temporarily stores data.

As described above, in the present exemplary embodiment, the rewritable non-volatility memory module 106 is a MLC flash memory module, and in which a plurality of floating voltages is used for representing a multi-bit data. To be specific, each memory cell of the memory cell array 502 has a plurality of storage states, and these storage states are distinguished by a plurality of bit data read voltages. In the exemplary embodiment, the control circuit 512 also controls the word line control circuit 504, the bit line control circuit 506, the column decoder 508, and the data I/O buffer 510 to read and write data.

Figure 6:
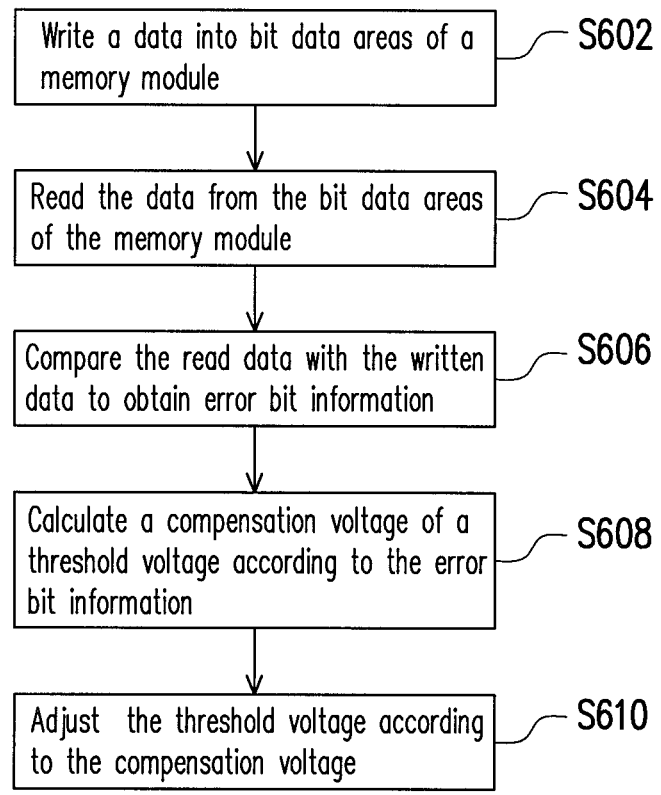
FIG. 6 is a flowchart of a threshold voltage adjustment method according to an exemplary embodiment of the invention.

FIG. 6 is a flowchart of a threshold voltage adjustment method according to an exemplary embodiment of the invention.

Referring to FIG. 6, in step S602, the memory management circuit 202 writes a data into the bit data areas of the rewritable non-volatility memory module 106. Then, in step S604, the memory management circuit 202 reads the data from the bit data areas of the rewritable non-volatility memory module 106. The data is corresponding to one of the storage states of the rewritable non-volatility memory module 106, and the voltage ranges of two storage states are distinguished by a threshold voltage.

In the present exemplary embodiment, when the memory management circuit 202 detects an uncorrectable error in the rewritable non-volatility memory module 106, the memory management circuit 202 controls the ECC circuit 256 to execute a threshold voltage adjustment method. For example, the ECC circuit 256 executes an ECC procedure according to an ECC frame to obtain an error bit number, and the memory management circuit 202 determines that an uncorrectable error occurs in the rewritable non-volatility memory module 106 when the error bit number exceeds a first predetermined value.

In the present exemplary embodiment, the memory management circuit 202 determines the test data (i.e., data to be written into the rewritable non-volatility memory module 106 and then read out from the same to be compared) according to the storage state of the rewritable non-volatility memory module 106, so as to adjust the threshold voltage. In other exemplary embodiments, the threshold voltage can also be adjusted by writing general data. Namely, when the memory management circuit 202 writes a data into the rewritable non-volatility memory module 106, it records the written data, and when subsequently the memory management circuit 202 reads the data from the rewritable non-volatility memory module 106, it compares the read data with the written data.

Next, in step S606, the memory management circuit 202 respectively compares each read data with the corresponding written data to obtain error bit information. In other words, the memory management circuit 202 executes a data processing procedure according to the read data to obtain the error bit information. For example, when the memory management circuit 202 writes data into the rewritable non-volatility memory module 106, it records the written data. Subsequently, the memory management circuit 202 compares the data read from the rewritable non-volatility memory module 106 with the recorded data to obtain the error bit information. Herein the error bit information includes number of error bit and type of error bit (for example, the storage state of the read data changing from 0 to 1 or from 1 to 0 in the case that each memory cell can only store a 1-bit data). In another exemplary embodiment of the invention, the data processing procedure may also be an ECC procedure. In this case, the memory management circuit 202 corrects the data by using an ECC code so as to obtain the error bit information.

After obtaining the error bit information, in step S608, the memory management circuit 202 calculates a compensation voltage of the threshold voltage according to the error bit information. In step S610, the memory management circuit 202 adjusts the threshold voltage according to the compensation voltage.

It should be noted that in the present exemplary embodiment, when the memory management circuit 202 partitions each physical page, it partitions the physical page into bit data areas having different data lengths. In particular, a bit data area having a relatively short data length is configured at the starting position of each physical page, wherein the ECC frame corresponding to the bit data area having the relatively short data length offers an optimal error bit correction capability. Thus, the ECC circuit 256 can provide an appropriate error bit information, and accordingly the memory management circuit 202 can selectively adjust the LLR lookup table or the threshold voltage of the memory cells according to the error bit information.

Aforementioned written data includes a plurality of bit data. Taking a first storage state and a second storage state with adjacent voltage ranges as an example, the memory management circuit 202 obtains a first error bit number of the bit data which is in the first storage state while being written and in the second storage state while being read. Besides the memory management circuit 202 obtains a second error bit number of the bit data which is in the second storage state while being written and in the first storage state while being read. Herein the voltage range of the first storage state is smaller than the voltage range of the second storage state, and the memory management circuit 202 calculates the compensation voltage by using following formula:

$$x = g \times \log_2\left(\frac{error2}{error1}\right).$$

In foregoing formula, x represents the compensation voltage, g represents a constant, error2 represents the second error bit number, and error1 represents the first error bit number.

After obtaining the compensation voltage x, the compensation voltage is added to the threshold voltage to obtain the adjusted threshold voltage.

Assuming each memory cell of the rewritable non-volatility memory module 106 stores two bit data, when the number of error bit produced by one physical page is greater than the first predetermined value or is beyond the error correction capability of the ECC circuit 256, the memory management circuit 202 first determines whether the physical page is a fast physical page or a slow physical page. If the physical page is a fast physical page, the memory management circuit 202 reads data from the fast physical page and compares the read data with the original data to find out the position of the error bit data. After that, the memory management circuit 202 reads the corresponding bit data from the position of the error bit data. The memory management circuit 202 determines the type of error bit according to the read bit data. For example, the written bit data is in the first storage state while the read bit data is in the second storage state, or the written bit data is in the second storage state while the read bit data is in the first storage state (herein the voltage ranges of the first storage state and the second storage state are next to each other). Accordingly, the memory management circuit 202 obtains the first error bit number of bit data which is in the first storage state but mistakenly determined to be in the second storage state in the fast physical page and obtains the second error bit number of bit data which is in the second storage state but mistakenly determined to be in the first storage state. On the other hand, if the physical page is a slow physical page, the memory management circuit 202 reads the corresponding bit data from the position of the error bit data in the slow physical page. Besides, the memory management circuit 202 reads the corresponding bit data in the fast physical page according to the position of the error bit data in the slow physical page. Thereafter, the memory management circuit 202 calculates the first error bit number and the second error bit number of the slow physical page according to aforementioned bit data.

In the present exemplary embodiment, after obtaining the error bit information, in order to increase the reliability of the obtained data, the memory management circuit 202 may further determine whether the number of error bit in the error bit information is greater than a second predetermined value and calculate the compensation voltage only when the number of error bit is greater than the second predetermined value.

The threshold voltage adjustment method is explained in detail in related paragraphs of Taiwan Patent No. 099111612, and these paragraphs are part of the present disclosure by quotation.

In the invention, besides adjusting the threshold voltage of the memory cells according to the error bit information, the memory storage device also selectively adjusts an LLR lookup table.

Figure 7:
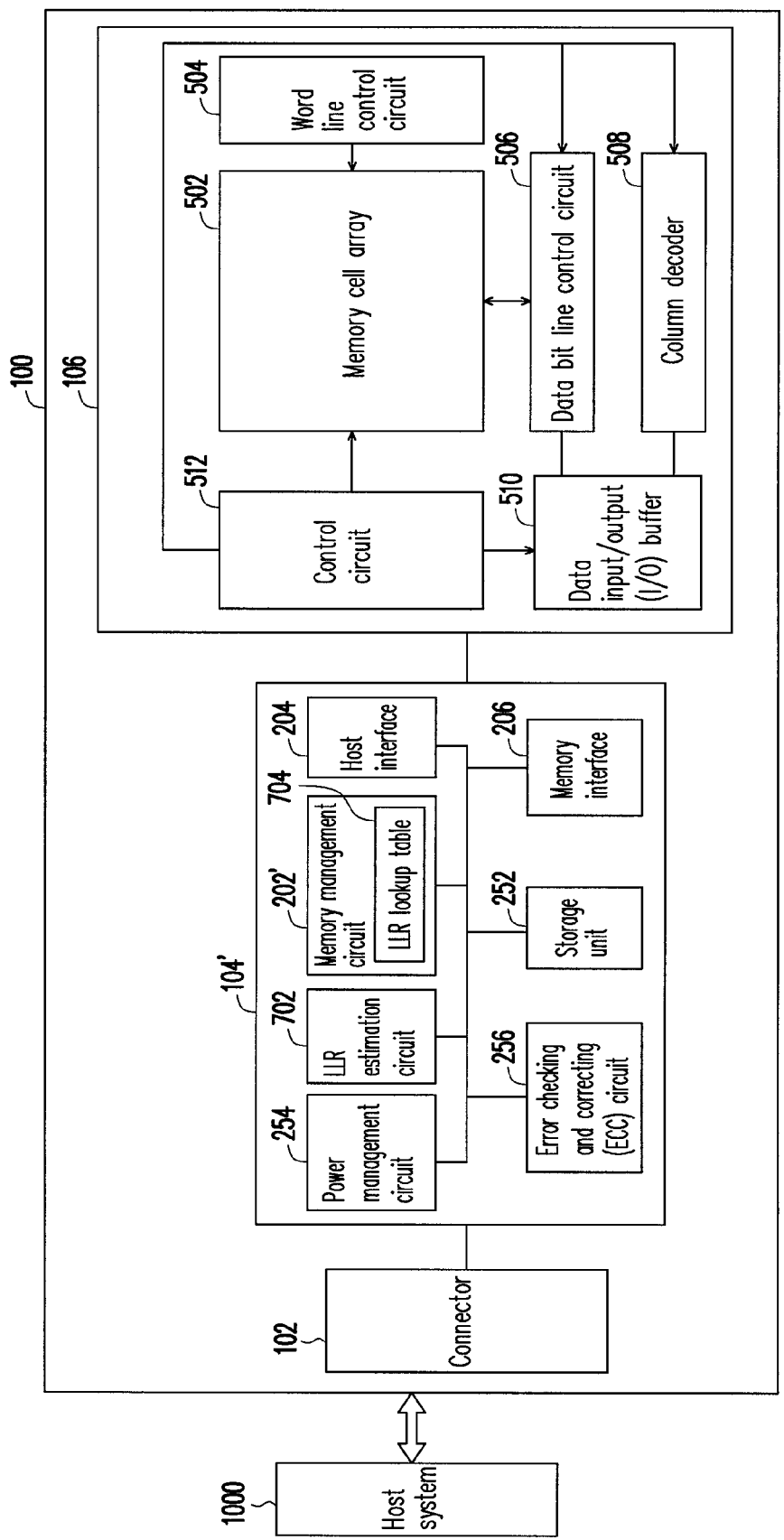
FIG. 7 is a schematic block diagram of a memory storage device according to an exemplary embodiment of the invention.

FIG. 7 is a schematic block diagram of a memory storage device according to an exemplary embodiment of the invention. Referring to FIG. 7, the memory controller 104' in the present exemplary embodiment further includes an LLR estimation circuit 702, and the memory management circuit 202' includes an LLR lookup table 704.

The LLR estimation circuit 702 is coupled to the memory management circuit 202' and the ECC circuit 256. The LLR estimation circuit 702 is configured to realize the LLR adjustment mechanism in the present exemplary embodiment. The operation detail of the LLR adjustment mechanism will be explained below with reference to accompanying drawings. In an exemplary embodiment, the LLR estimation circuit 702 is implemented into a plurality of control instructions in a hardware form. In other exemplary embodiments, the LLR estimation circuit 702 may also be implemented into control instructions in a firmware form or as program codes.

Figures 8, 9:
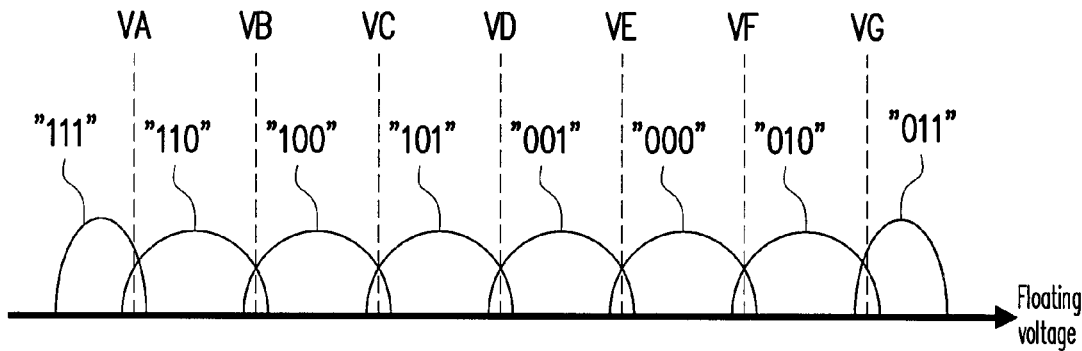
FIG. 8 is a diagram of storage states and bit data read voltages according to an exemplary embodiment of the invention.
FIG. 9 illustrates the correspondence between storage states in which storage errors may occur in the exemplary embodiment illustrated in FIG. 8.

FIG. 8 is a diagram of storage states and bit data read voltages according to an exemplary embodiment of the invention. In the present exemplary embodiment, the rewritable non-volatility memory module 106 is an 8-level cell NAND flash memory. As shown in FIG. 8, the floating voltage in each memory cell is categorized into one of eight storage states (i.e., "111", "110", "100", "101", "001", "000", "010", and "011") according to a first bit data read voltage VA, a second bit data read voltage VB, a third bit data read voltage VC, a fourth bit data read voltage VD, a fifth bit data read voltage VE, a sixth bit data read voltage VF, and a seventh bit data read voltage VG. Each storage state includes a least significant bit (LSB), a center significant bit (CSB), and a most significant bit (MSB). For example, in the present exemplary embodiment, the first bit from the left of each storage state is the LSB, the second bit from the left is the CSB, and the third bit from the left is the MSB. Accordingly, each memory cell can store a 3-bit data, and the memory cells on the same word line constitute a storage space of 3 physical pages (i.e., a lower physical page, a center physical page, and an upper physical page). Namely, the LSB of each memory cell is corresponding to the lower physical page, the CSB of each memory cell is corresponding to the center physical page, and the MSB of each memory cell is corresponding to the upper physical page. In addition, several physical pages constitute a physical block, and physical block is the smallest unit for erasing data. Namely, each physical block contains the least number of memory cells that are erased together. In the present exemplary embodiment, the eight storage states has a storage state sequence of "111", "110", "100", "101", "001", "000", "010", and "011". However, the storage state sequence is not limited herein, and which varies with the design of different rewritable non-volatile memory chip.

FIG. 9 illustrates the correspondence between storage states in which storage errors may occur in the exemplary embodiment illustrated in FIG. 8. In FIG. 9, the storage state to the right of "→" represents the first storage state of the read data, and the storage state to the left of "→" represents the second storage state of the read data.

Referring to both FIG. 8 and FIG. 9, when the first storage state of a read data is "000", the possible second storage states are "010" and "001". When the first storage state of the read data is "001", the possible second storage states are "101" and "000". When the first storage state of the read data is "010", the possible second storage states are "000" and "011", and so on.

Those fields in FIG. 9 marked with "*" indicate that if the read data is corresponding to the first storage state when it is read, the possibility that any storage error occurs in the bit data is very low. For example, when the first storage state of the read data is "100", if a storage error occurs in the LSB, the second storage state of the read data should be "000". However, it is already assumed in the present exemplary embodiment that storage errors only occur between storage states next to each other in the storage state sequence and as shown in FIG. 8, the storage state "000" and the storage state "100" are not adjacent. Thus, when the first storage state of the read data is "100", the possibility that a storage error occurs in the LSB is very low. Herein it is assumed that the second storage state of the read data will never be "000" (i.e., an LLR having its LSB as 0 is negative infinity).

In an exemplary embodiment, when the LLR estimation circuit 702 determines the first storage state of a read data to be "001" and the second storage state thereof to be "000", the LLR estimation circuit 702 obtains a sum of storage error of data which data is in the storage state "000" while being written and in the storage state "001" while being read among the data stored in the memory cells of the total error number, and the LLR estimation circuit 702 calculates an LLR by using following formula (1). However, if the first storage state of a read data is "001" and the second storage state thereof is "100", because the first storage state and the second storage state are not adjacent in the storage state sequence, the LLR estimation circuit 702 sets the LLR to positive infinity or negative infinity according to the value of a read bit data of the read data. The correspondence illustrated in FIG. 9 can be used for calculating the LLR when the storage error of the read data occurs in the LSB, the CSB, or the MSB.

Figure 10:
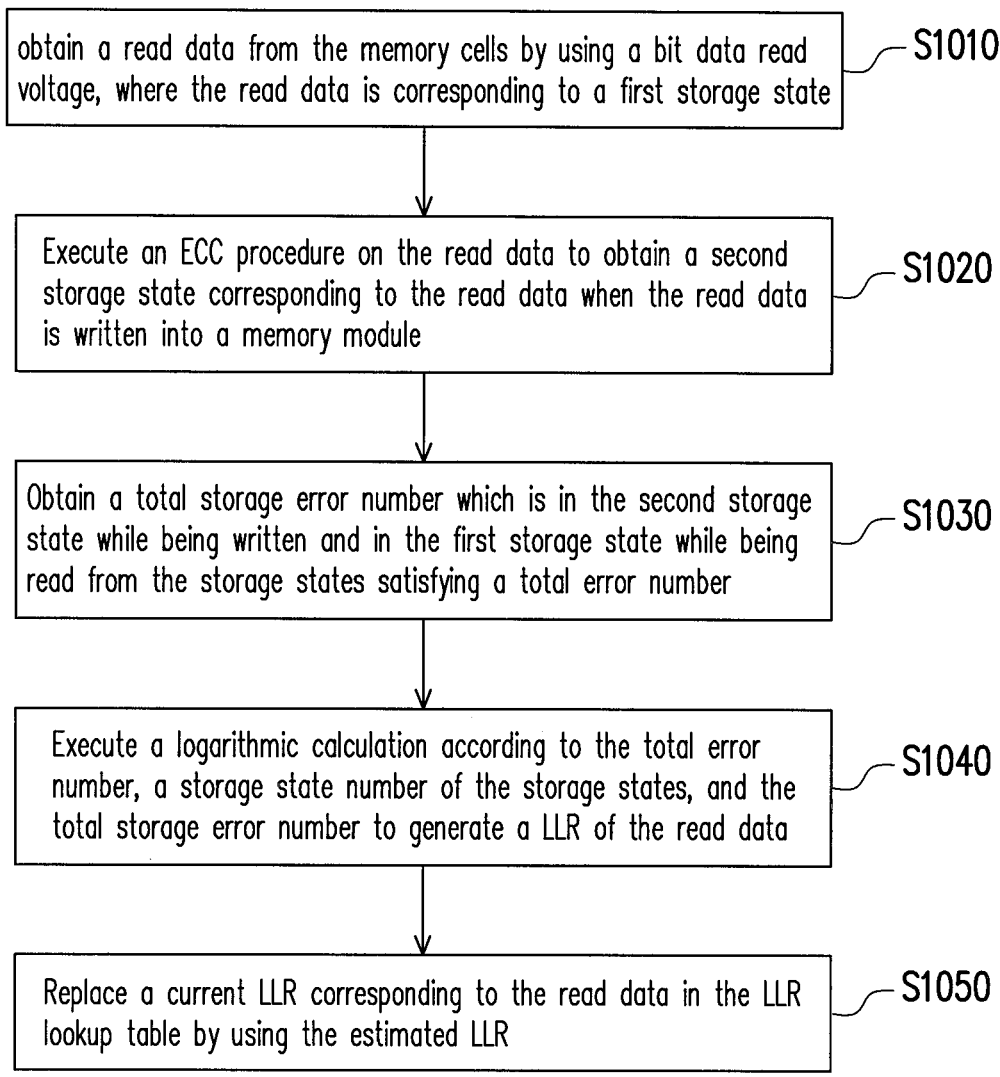
FIG. 10 is a flowchart of a log likelihood ratio (LLR) adjustment method according to an exemplary embodiment of the invention.

FIG. 10 is a flowchart of an LLR adjustment method according to an exemplary embodiment of the invention.

After the memory storage device 100 receives a read command issued by the host system 1000, in step S1010, the memory management circuit 202' of the memory controller 104' instructs the rewritable non-volatility memory module 106 to obtain a read data from the memory cells by using a bit data read voltage, where the read data is corresponding to a first storage state.

Then, in step S1020, the ECC circuit 256 of the memory controller 104' executes an ECC procedure on the read data to obtain a second storage state corresponding to the read data when the read data is written into the rewritable non-volatility memory module 106.

Next, in step S1030, the LLR estimation circuit 702 of the memory controller 104' obtains a sum of storage error (i.e. storage error means data is in the second storage state while being written and in the first storage state while being read) from the storage states satisfying a total error number (sum of error).

In step S1040, the LLR estimation circuit 702 executes a logarithmic calculation according to the total error number, number of the storage states, and the sum of storage error to generate an LLR of the read data, where the LLR is calculated by using following formula:

$$LLR\_c = -\left(\log\left[\frac{S}{N}\right] - \log[W]\right) \qquad (1)$$

In foregoing formula, LLR_c represents the LLR, N represents the total error number, S represents the number of the storage states, and W represents the sum of storage error.

After that, in step S1050, the LLR estimation circuit 702 updates the LLR lookup table 704 in the memory management circuit 202' by directly using the estimated LLR. Namely, the LLR estimation circuit 702 replaces the current LLR corresponding to the read data in the LLR lookup table 704 by using the estimated LLR.

The LLR adjustment method is explained in detail in related paragraphs of Taiwan Patent No. 099131626, and these paragraphs are part of the present disclosure by quotation.

Figure 11:
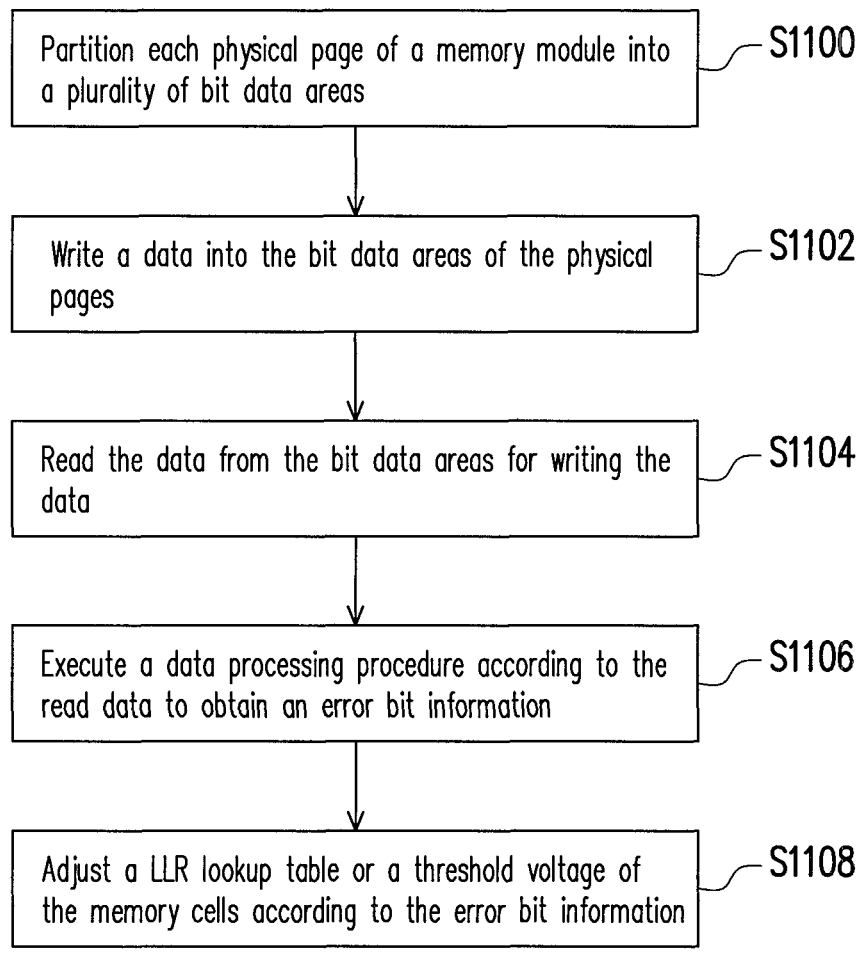
FIG. 11 is a flowchart of a data reading method according to an exemplary embodiment of the invention.

FIG. 11 is a flowchart of a data reading method according to an exemplary embodiment of the invention.

Referring to both FIG. 2 and FIG. 11, the data reading method in the present exemplary embodiment is adapted to a rewritable non-volatility memory module, and which includes following steps. First, in step S1100, each physical page of the rewritable non-volatility memory module 106 is partitioned into a plurality of bit data areas, where the lengths and number of bit data areas in a partitioned physical page are as shown in FIG. 4. Then, in step S1102, a data is written into the bit data areas of the physical pages. Next, in step S1104, the data is read from the bit data areas. After that, in step S1106, a data processing procedure is executed according to the read data to obtain an error bit information. Herein the data processing procedure includes comparing the read data with the original written data. Or, the data processing procedure may be an ECC procedure. Next, in step S1108, an LLR lookup table or a threshold voltage of memory cells is adjusted according to the error bit information.

Additionally, the data reading method provided by exemplary embodiments of the invention can be well understood and implemented by referring to descriptions of the exemplary embodiments illustrated in FIG. 1-FIG. 10 therefore will not be further described herein.

In summary, in an exemplary embodiment of the invention, the ECC frame corresponding to the bit data area having a relative short data length offers an optimal error bit correction capability. Thus, when a memory storage device executes an ECC procedure on a read data, the read data can be effectively checked and corrected. Moreover, the memory storage device can selectively adjust an LLR lookup table or a threshold voltage of memory cells according to the obtained error bit information.

The previously described exemplary embodiments of the present invention have many advantages, including offering an optimal error bit correction capability and effectively checked and corrected data, wherein the advantages aforementioned not required in all versions of the invention.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A data reading method, adapted to a rewritable non-volatility memory module, wherein the rewritable non-volatility memory module has a plurality of physical blocks, and each of the physical blocks has a plurality of physical pages, the data reading method comprising:
partitioning each of the physical pages into a plurality of bit data areas, wherein in each of the physical pages, at least one of the bit data areas has a data length different from the other bit data areas;
writing data into the bit data areas, wherein each of the bit data areas is corresponding to an error checking and correcting (ECC) frame, and among the ECC frames, the ECC frame corresponding to the at least one bit data area has a relatively short data length;
reading the data from the bit data areas;
executing a data processing procedure according to the read data to obtain an error bit information; and
adjusting a log likelihood ratio (LLR) lookup table or at least one threshold voltage according to the error bit information.

2. The data reading method according to claim 1, wherein the step of partitioning each of the physical pages comprises:
configuring the at least one bit data area at a starting position of each of the physical pages,
wherein the ECC frame corresponding to the at least one bit data area has an optimal error bit correction capability.

3. The data reading method according to claim 1, wherein the step of adjusting the threshold voltage comprises:
calculating a compensation voltage of the threshold voltage according to the error bit information; and
adjusting the threshold voltage by using the compensation voltage.

4. The data reading method according to claim 3, wherein the step of executing the data processing procedure according to the read data to obtain the error bit information comprises comparing the read data with the written data to obtain a first error bit number and a second error bit number, wherein the compensation voltage is calculated by using following formula:

$$x = g \times \log_2\left(\frac{error2}{error1}\right)$$

wherein x represents the compensation voltage, g represents a constant, error1 represents the first error bit number, and error2 represents the second error bit number.

5. The data reading method according to claim 1, wherein the rewritable non-volatility memory module has a plurality of memory cells, each of the memory cells has a plurality of storage states, and the read data is corresponding to a first storage state, wherein the step of executing the data processing procedure according to the read data to obtain the error bit information comprises executing an ECC procedure on the read data to obtain a second storage state corresponding to the written data.

6. The data reading method according to claim 5, wherein the step of adjusting the LLR lookup table comprises:
obtaining a sum of storage error which data is in the second storage state while being written and in the first storage state while being read from the storage states satisfying a total error number; and
executing a logarithmic calculation according to the total error number, number of the storage states, and the sum of storage error to generate an LLR of the read data, wherein the LLR is calculated by using following formula:

$$LLR\_c = -\left(\log\left[\frac{S}{N}\right] - \log[W]\right)$$

wherein LLR_c represents the LLR, N represents the total error number, S represents the number of the storage states, and W represents the sum of storage error.

7. The data reading method according to claim 6, wherein the rewritable non-volatility memory module is disposed in a memory storage device, the memory storage device comprises the LLR lookup table, and the LLR lookup table records a current LLR corresponding to the read data, wherein the step of adjusting the LLR lookup table further comprises:
replacing the current LLR in the LLR lookup table by using the LLR.

8. A memory controller, comprising:
a host system interface, coupled to a host system;
a memory interface, coupled to a rewritable non-volatility memory module, wherein the rewritable non-volatility memory module has a plurality of physical blocks, and each of the physical blocks has a plurality of physical pages;
a memory management circuit, coupled to the host system interface and the memory interface, wherein the memory management circuit partitions each of the physical pages into a plurality of bit data areas, writes data into the bit data areas, reads the data from the bit data areas, executes a data processing procedure according to the read data to obtain an error bit information, and adjusts at least one threshold voltage according to the error bit information; and an LLR estimation circuit, coupled to the memory management circuit, wherein the LLR estimation circuit adjusts an LLR lookup table according to the error bit information, wherein in each of the physical pages, at least one of the bit data areas has a data length different from the other bit data areas, each of the bit data areas is corresponding to an ECC frame, and among the ECC frames, the ECC frame corresponding to the at least one bit data area has a relatively short data length.

9. The memory controller according to claim 8, wherein the memory management circuit configures the at least one bit data area having the relatively short data length at a starting position of each of the physical pages, wherein the ECC frame corresponding to the at least one bit data area has an optimal error bit correction capability.

10. The memory controller according to claim 8, wherein the memory management circuit calculates a compensation voltage of the threshold voltage according to the error bit information and adjusts the threshold voltage by using the compensation voltage.

11. The memory controller according to claim 10, wherein the memory management circuit executes the data processing procedure by comparing the read data with the written data to obtain a first error bit number and a second error bit number, wherein the compensation voltage is calculated by using following formula:

$$x = g \times \log_2\left(\frac{error2}{error1}\right)$$

wherein x represents the compensation voltage, g represents a constant, error1 represents the first error bit number, and error2 represents the second error bit number.

12. The memory controller according to claim 8, wherein the rewritable non-volatility memory module has a plurality of memory cells, each of the memory cells has a plurality of storage states, the read data is corresponding to a first storage state, and the memory management circuit executes the data processing procedure by executing an ECC procedure on the read data to obtain a second storage state corresponding to the written data.

13. The memory controller according to claim 12, wherein the LLR estimation circuit obtains a sum of storage error which data is in the second storage state while being written and in the first storage state while being read from the storage states satisfying a total error number and executes a logarithmic calculation according to the total error number, number of the storage states, and the sum of storage error to generate an LLR of the read data, wherein the LLR is calculated by using following formula:

$$LLR\_c = -\left(\log\left[\frac{S}{N}\right] - \log[W]\right)$$

wherein LLR_c represents the LLR, N represents the total error number, S represents the number of the storage states, and W represents the sum of storage error.

14. The memory controller according to claim 13, wherein the memory management circuit has the LLR lookup table, the LLR lookup table records a current LLR corresponding to the read data, and the LLR estimation circuit replaces the current LLR in the LLR lookup table by using the LLR.

15. A memory storage device, comprising:
a connector, coupled to a host system;
a rewritable non-volatility memory module, having a plurality of physical blocks, wherein each of the physical blocks has a plurality of physical pages; and
a memory controller, coupled to the rewritable non-volatility memory module and the connector, wherein the memory controller partitions each of the physical pages into a plurality of bit data areas, writes data into the bit data areas, reads the data from the bit data areas, executes a data processing procedure according to the read data to obtain an error bit information, and adjusts an LLR lookup table or at least one threshold voltage according to the error bit information,
wherein in each of the physical pages, at least one of the bit data areas has a data length different from the other bit data areas, each of the bit data areas is corresponding to an ECC frame, and among the ECC frames, the ECC frame corresponding to the at least one bit data area has a relatively short data length.

16. The memory storage device according to claim 15, wherein the memory controller configures the at least one bit data area at a starting position of each of the physical pages, wherein the ECC frame corresponding to the at least one bit data area has an optimal error bit correction capability.

17. The memory storage device according to claim 15, wherein the memory controller calculates a compensation voltage of the threshold voltage according to the error bit information and adjusts the threshold voltage by using the compensation voltage.

18. The memory storage device according to claim 17, wherein the memory controller executes the data processing procedure by comparing the read data with the written data to obtain a first error bit number and a second error bit number, wherein the compensation voltage is calculated by using following formula:

$$x = g \times \log_2\left(\frac{error2}{error1}\right)$$

wherein x represents the compensation voltage, g represents a constant, error1 represents the first error bit number, and error2 represents the second error bit number.

19. The memory storage device according to claim 15, wherein the rewritable non-volatility memory module has a plurality of memory cells, each of the memory cells has a plurality of storage states, the read data is corresponding to a first storage state, and the memory controller executes the data processing procedure by executing an ECC procedure on the read data to obtain a second storage state corresponding to the written data.

20. The memory storage device according to claim 19, wherein the memory controller obtains a sum of storage error which is in the second storage state while being written and in the first storage state while being read from the storage states satisfying a total error number and executes a logarithmic calculation according to the total error number, number of the storage states, and the sum of storage error to generate an LLR of the read data, wherein the LLR is calculated by using following formula:

$$LLR\_c = -\left(\log\left[\frac{S}{N}\right] - \log[W]\right)$$

wherein LLR_c represents the LLR, N represents the total error number, S represents the number of the storage states, and W represents the sum of storage error.

21. The memory storage device according to claim 20, wherein the memory controller has the LLR lookup table, the LLR lookup table records a current LLR corresponding to the read data, and the memory controller replaces the current LLR in the LLR lookup table by using the LLR.

* * * * *